(12) United States Patent
Dolganov et al.

(10) Patent No.: US 12,366,638 B2
(45) Date of Patent: Jul. 22, 2025

(54) DRIVER CIRCUIT FOR AN ADDRESSABLE ARRAY OF OPTICAL EMITTERS

(71) Applicant: Lumentum Operations LLC, San Jose, CA (US)

(72) Inventors: Mikhail Dolganov, Gilroy, CA (US); Lijun Zhu, Dublin, CA (US); Hao Huang, San Jose, CA (US); Sean Burns, Menlo Park, CA (US)

(73) Assignee: Lumentum Operations LLC, San Jose, CA (US)

( * ) Notice: Subject to any disclaimer, the term of this patent is extended or adjusted under 35 U.S.C. 154(b) by 967 days.

(21) Appl. No.: 17/304,074

(22) Filed: Jun. 14, 2021

(65) Prior Publication Data
US 2022/0299604 A1    Sep. 22, 2022

Related U.S. Application Data (60) Provisional application No. 63/200,673, filed on Mar. 22, 2021, provisional application No. 63/201,137, filed on Apr. 14, 2021.

(51) Int. Cl.
| | |
|---|---|
| *H01S 5/042* | (2006.01) |
| *G01S 7/484* | (2006.01) |
| *G01S 7/4865* | (2020.01) |
| *G01S 17/10* | (2020.01) |
| *G01S 17/89* | (2020.01) |

(52) U.S. Cl.
CPC ............ *G01S 7/484* (2013.01); *G01S 7/4865* (2013.01); *G01S 17/10* (2013.01); *G01S 17/89* (2013.01); *H01S 5/0428* (2013.01)

(58) Field of Classification Search
CPC ........ G01S 7/484; G01S 7/4865; G01S 17/10; G01S 17/89; G01S 7/4815; G01S 17/48; H01S 5/0428
See application file for complete search history.

(56) References Cited

U.S. PATENT DOCUMENTS

| | | | |
|---|---|---|---|
| 10,158,211 B2 * | 12/2018 | Barnes | ...................... H01S 3/10 |
| 2017/0339361 A1 * | 11/2017 | Gancarz | .................. G01S 17/89 |
| 2018/0301875 A1 * | 10/2018 | Burroughs | ............ H01S 5/0071 |
| 2020/0092504 A1 * | 3/2020 | Allen | ...................... G01S 7/4816 |
| 2020/0333438 A1 | 10/2020 | Petrov et al. | |
| 2021/0066885 A1 | 3/2021 | Kuo et al. | |
| 2021/0296855 A1 * | 9/2021 | Huang | .................... G01S 17/36 |
| 2022/0137230 A1 | 5/2022 | Schleuning et al. | |

* cited by examiner

*Primary Examiner* — Xinning (Tom) Niu
(74) *Attorney, Agent, or Firm* — Harrity & Harrity, LLP (57) ABSTRACT

In some implementations, a driver circuit may include a source to provide an electrical input and an array of optical emitters arranged in one or more rows and one or more columns. The array of optical emitters may include an optical emitter associated with a row of the one or more rows and a column of the one or more columns. The driver circuit may include a first switch having an open state and a closed state and a capacitive element connected to the row. The first switch in the closed state may cause charging of the capacitive element. The driver circuit may include a second switch having an open state and a closed state. The second switch in the closed state may select the column, and may cause discharging of the capacitive element through the row and the column to provide an electrical pulse to the optical emitter.

20 Claims, 3 Drawing Sheets

DRIVER CIRCUIT FOR AN ADDRESSABLE ARRAY OF OPTICAL EMITTERS

CROSS-REFERENCE TO RELATED APPLICATION

This Patent Application claims priority to U.S. Provisional Patent Application No. 63/200,673, filed on Mar. 22, 2021, and entitled "TWO-DIMENSIONAL ADDRESSABLE LASER MATRIX DRIVING ARCHITECTURE," and to U.S. Provisional Patent Application No. 63/201,137, filed on Apr. 14, 2021, and entitled "TWO-DIMENSIONAL ADDRESSABLE LASER MATRIX DRIVING ARCHITECTURE." The disclosures of the prior Applications are considered part of and are incorporated by reference into this Patent Application.

TECHNICAL FIELD

The present disclosure relates generally to an addressable array of optical emitters and to a driver circuit for an addressable array of optical emitters.

BACKGROUND

Light detection and ranging (LIDAR) systems, such as time-of-flight (ToF)-based measurement systems, emit optical pulses, detect reflected optical pulses, and determine distances to objects by measuring delays between the emitted optical pulses and the reflected optical pulses.

SUMMARY

In some implementations, a driver circuit includes a source to provide an electrical input; an array of optical emitters arranged in one or more rows and one or more columns, wherein the array of optical emitters includes an optical emitter associated with a row of the one or more rows and a column of the one or more columns; a first switch having an open state and a closed state; a capacitive element connected to the row, wherein the first switch in the closed state is to cause charging of the capacitive element; and a second switch having an open state and a closed state, wherein the second switch in the closed state is to select the column, and wherein the second switch in the closed state is to cause discharging of the capacitive element through the row and the column to provide an electrical pulse to the optical emitter associated with the row and the column.

In some implementations, a controller for an array of optical emitters arranged in a plurality of rows and a plurality of columns includes a plurality of capacitive elements respectively connected to the plurality of rows; a plurality of first switches respectively connected to the plurality of capacitive elements, wherein the plurality of first switches have an open state and a closed state, and wherein a first switch, of the plurality of first switches, in the closed state is to cause current to charge a capacitive element, of the plurality of capacitive elements, for a row of the plurality of rows; and a plurality of second switches respectively connected to the plurality of columns, wherein the plurality of second switches have an open state and a closed state, and wherein a second switch, of the plurality of second switches, connected to a column of the plurality of columns, in the closed state is to cause discharging of the capacitive element through the row and the column.

In some implementations, an optical source includes an array of optical emitters arranged in one or more rows and one or more columns, and a driver circuit, comprising: one or more capacitive elements respectively connected to the one or more rows, where the one or more capacitive elements are configured to discharge through respective rows of the one or more rows; and one or more switches respectively connected to the one or more columns, wherein the one or more switches have an open state and a closed state, and wherein a switch, of the one or more switches, in the closed state is to select a column of the one or more columns.

DETAILED DESCRIPTION

The following detailed description of example implementations refers to the accompanying drawings. The same reference numbers in different drawings may identify the same or similar elements.

LIDAR systems, such as ToF-based measurement systems (e.g., a direct ToF LIDAR system), require high power optical pulses of short duration (e.g., 10 nanoseconds (ns) or less). High power optical pulses may enable greater distance range finding. Shorter duration optical pulses may enable improved resolution. For a laser-based optical load (e.g., a laser diode, a semiconductor laser diode, a vertical-cavity surface-emitting laser (VCSEL), or the like), a higher electrical current across the optical load corresponds to a higher power optical pulse. As noted, ToF-based measurement systems may determine distances to objects by measuring delays between an emitted optical pulse and a reflected optical pulse. Emitting pulses having a well-defined origin in time and rectangular shape simplifies the measurements. To achieve such a rectangular shape, emitted optical pulses should have short rise times (e.g., a time during which power of the optical pulse is rising from zero or near zero to peak power) and short fall times (e.g., a time during which power of the optical pulse is falling from peak power to zero or near zero).

A circuit for driving an optical load is a set of electronic components interconnected by current-carrying conductors (e.g., traces). Any of the electronic components and conductors may have parasitic elements (e.g., a parasitic inductance, a parasitic resistance, and/or a parasitic capacitance). For example, the traces in an array (e.g., a matrix) of optical emitters may be long, thereby resulting in high parasitic inductances. These parasitic elements may be undesirable, and, therefore, ought to be minimized. However, it may not be possible to completely eliminate these parasitic elements. When a supply voltage is provided to the circuit to drive the optical load, the parasitic elements in the circuit cause a delay between when the supply voltage is provided and when the current reaches a peak. The delay increases the rise time of the electrical pulse, which increases the rise time of the optical pulse. In other words, the parasitic elements make it difficult to produce optical pulses of short duration, which are useful for LIDAR systems. Furthermore, when the supply voltage is turned off, energy (e.g., electrical energy) stored by the parasitic inductance, the parasitic resistance, and/or the parasitic capacitance of the electrical components generates a decaying, oscillating (e.g., ringing) current in the circuit, which increases the fall time of the electrical pulse, which increases the fall time of the optical pulse.

Previous driver circuits for optical emitter arrays are complex, excessively bulky, and do not adequately address the aforementioned problems. For example, previous driver circuits may not be capable of generating optical pulses of short duration, such as optical pulses having short rise time. As an example, previous driver circuits may include a capacitor for driving an optical load at an input side of a high side switch, thereby preventing optical pulses of short duration and/or short rise time. Moreover, the capacitor may be shared among the optical emitters, and the capacitor may be connected directly to an input power supply, such that a discharge mode for the driver circuit is not possible.

Some implementations described herein provide a driver circuit for an array of optical emitters. The driver circuit provides addressability of individual emitters of the array. Moreover, the driver circuit is configured to generate optical pulses of various widths and with short rise times. Accordingly, the driver circuit can be used in ToF-based measurement systems, such as LIDAR systems, to provide greater distance range finding and improved resolution.

In some implementations the driver circuit includes an array of optical emitters arranged in one or more rows and one or more columns. The driver circuit may include respective capacitive elements connected to each row of the array of optical emitters, and charging of each capacitive element may be controlled by a respective switch (e.g., thereby enabling a particular row to be addressed). The capacitive elements operate as voltage sources capable of generating electrical pulses having short rise times, and thus optical pulses having short rise times. The driver circuit may also include respective switches associated with each column of the array of optical emitters. These switches control column selection (e.g., by controlling completion of respective circuit paths including the columns), thereby causing a capacitive element to discharge through a selected column. Accordingly, the driver circuit described herein is simplified relative to previous driver circuits and suitable for miniaturization.

Figure 1:
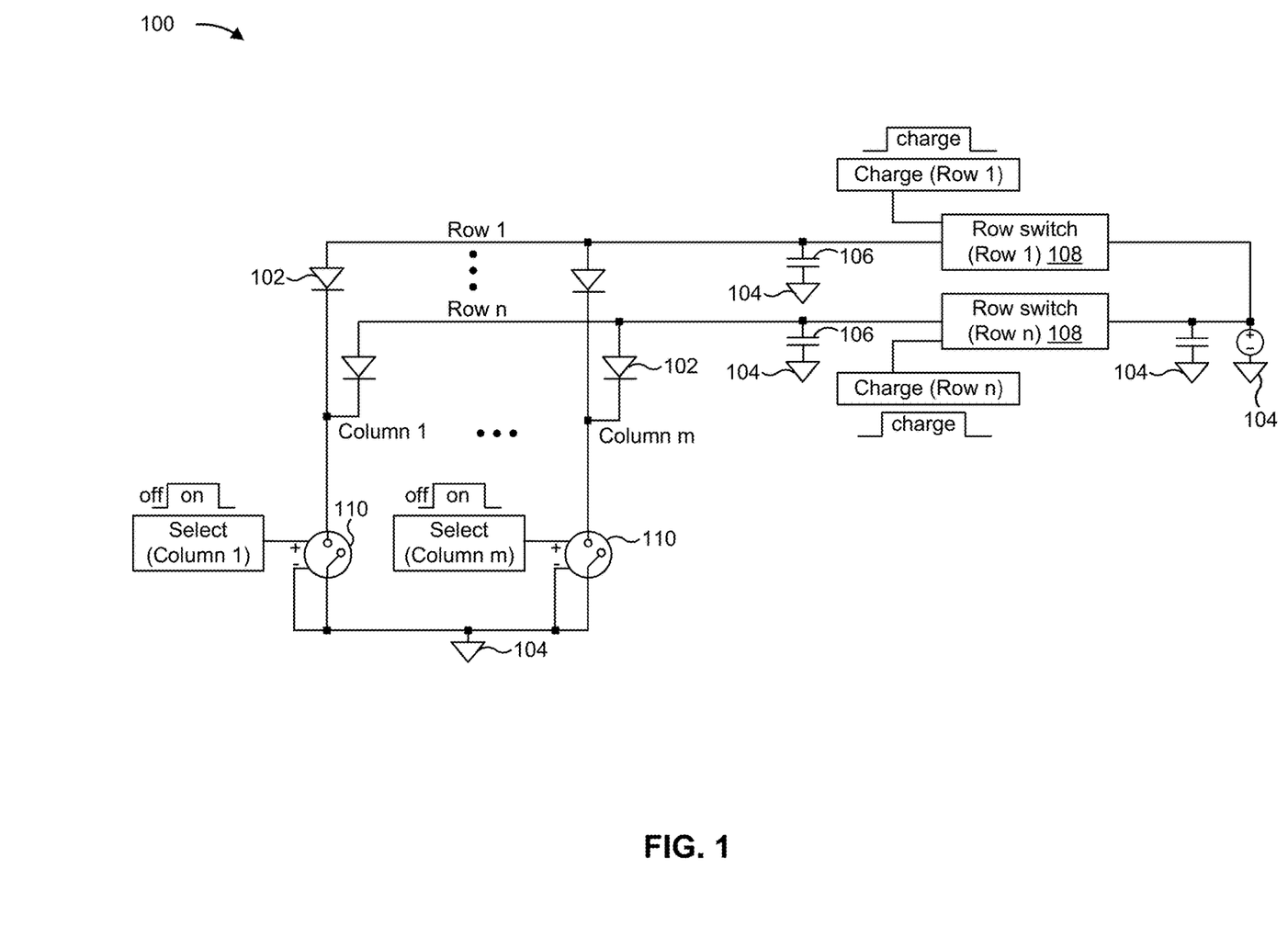
FIG. 1 is a diagram of an example driver circuit architecture described herein.

FIG. 1 is a diagram of an example driver circuit architecture 100 described herein. The driver circuit architecture 100 may include an array of optical emitters 102. The array of optical emitters 102 may include a plurality of optical emitters 102. An optical emitter 102 may include a light-emitting diode (LED), a laser diode, a semiconductor laser diode, a VCSEL, and/or an edge-emitting emitter (e.g., an edge-emitting laser), among other examples. The array of optical emitters 102 may be arranged into one or more (e.g., a plurality of) rows (shown as Rows 1-$n$) and one or more (e.g., a plurality of) columns (shown as Columns 1-$m$). For example, n and m may be equal, n may be greater than m, or m may be greater than n. In some implementations, the array of optical emitters 102 is a two-dimensional array whereby the optical emitters 102 are arranged into a plurality of rows and a plurality of columns. For example, the array of optical emitters 102 may include 10 or more rows, 12 or more rows, 15 or more rows, etc., and 10 or more columns, 12 or more columns, 15 or more columns, etc. As an example, the array of optical emitters 102 may include 16 rows and 12 columns. In some implementations, the array of optical emitters 102 is a one-dimensional array whereby the optical emitters 102 are arranged into a single row (that includes a plurality of columns) or arranged into a single column (that includes a plurality of rows).

The driver circuit architecture 100 may include a ground 104. The driver circuit architecture 100 may include one or more (e.g., a plurality of) capacitive elements 106. A capacitive element 106 may include a capacitor configured to store energy in response to current flowing through the capacitor, and configured to discharge the stored energy from the capacitor. Each row of the array of optical emitters 102 may be connected to a respective capacitive element 106 (e.g., at an anode side of the array of optical emitters 102). Thus, each capacitive element 106 operates as a voltage source for a particular row of the array of optical emitters 102.

The driver circuit architecture 100 may include one or more (e.g., a plurality of) first switches 108 (which may be referred to herein as row switches 108). Each row of the array of optical emitters 102 may be connected to a respective row switch 108 (e.g., at an anode side of the array of optical emitters 102). Each row switch 108 may control charging of a capacitive element 106 for a particular row of the array of optical emitters 102. Thus, the capacitive element 106 may be between the row switch 108 and the optical emitters 102 (e.g., anodes of the optical emitters 102) of the row.

As described in greater detail below, the driver circuit architecture 100 may be configured to supply current to a capacitive element 106 in response to a "charge" signal (e.g., provided by an external controller) for the capacitive element 106. For example, a "charge" signal may cause a particular row switch 108 to close, thereby supplying current to a capacitive element 106 controlled by the row switch 108. The current supplied to the capacitive element 106 may charge the capacitive element 106.

The driver circuit architecture 100 may include one or more (e.g., a plurality of) second switches 110 (which may be referred to herein as column switches 110). Each column of the array of optical emitters 102 may be connected to a respective column switch 110 (e.g., at a cathode side of the array of optical emitters 102). Thus, each column switch 110 controls selection of a particular column of the array of optical emitters 102. Selecting a particular column may complete a circuit path that includes an optical emitter 102 of the particular column. The circuit path may also include a capacitive element 106 associated with a particular row of the array of optical emitter 102. Thus, completing the circuit path causes discharging of the capacitive element 106 through the row and the column, thereby providing an electrical pulse to the optical emitter 102.

As described in greater detail below, in response to an "on" signal (e.g., provided by an external controller) for a column switch 110, the column switch 110 may close and complete a cathode path of a column of the array of optical emitters 102 (e.g., complete a circuit path that includes the column). That is, the "on" signal may provide selection of the column of the array of optical emitters 102. Thus, energy discharged from a capacitive element 106 to a row of the array of optical emitters 102 may flow through the column that is selected by the column switch 110. In this way, the capacitive element 106 and the column switch 110 operate together to address (e.g., drive) a particular optical emitter 102 that is associated with the row and the column. In response to an "off" signal (e.g., provided by an external controller) for the column switch 110, the column switch 110 may open to prevent the capacitive element 106 from discharging through the column.

In some implementations, multiple capacitive elements 106 may be charged simultaneously or near-simultaneously (e.g., within 1 ns of each other) and discharged simultaneously or near-simultaneously. Additionally, or alternatively, multiple columns of the array of optical emitters 102 may be selected simultaneously or near-simultaneously.

As indicated above, FIG. 1 is provided as an example. Other examples may differ from what is described with regard to FIG. 1.

Figure 2:
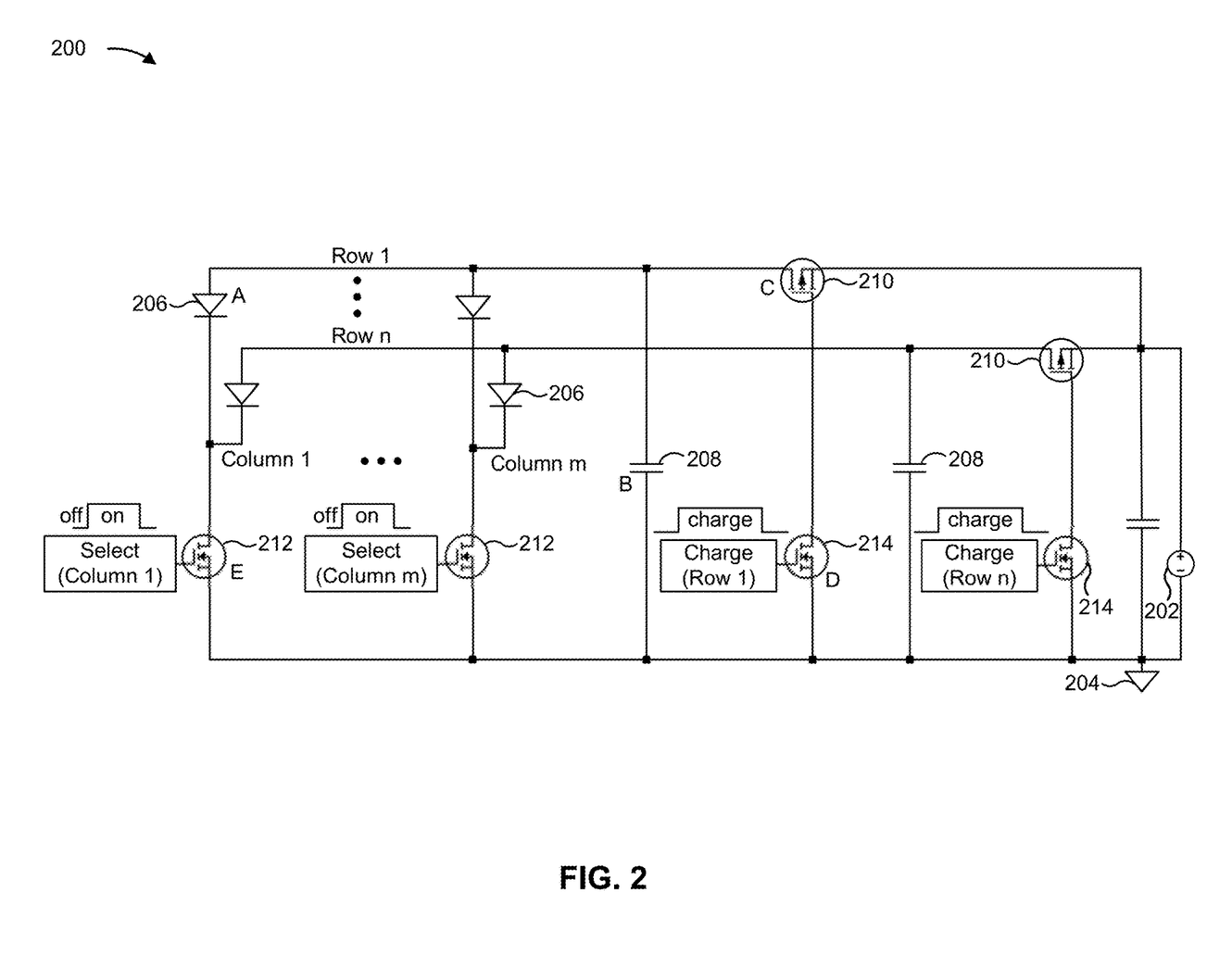
FIG. 2 is a diagram of an example driver circuit described herein.

FIG. 2 is a diagram of an example driver circuit 200 described herein. The driver circuit 200 may include the driver circuit architecture 100, described above.

The driver circuit 200 may include a source 202. The source 202 may provide an electrical input of the driver circuit 200. For example, the source 202 may provide current to the driver circuit 200. The source 202 may be a direct current (DC) voltage source, a DC current source with a resistive load, or the like. The driver circuit 200 may include a ground 204.

The driver circuit 200 may include an array of optical emitters 206, as described above. For example, the array of optical emitters 206 may correspond to the array of optical emitters 102, described above. In an example used throughout the description of FIG. 2, the array of optical emitters 206 may include an optical emitter 206 A associated with Row 1 and Column 1 of the array of optical emitters 206.

The driver circuit 200 may include one or more (e.g., a plurality of) capacitive elements 208. The capacitive elements 208 may operate in a similar manner as the capacitive elements 106 described above. For example, a capacitive element 208 may provide a voltage source of the driver circuit 200, as described above. A capacitive element 208 may include one or more capacitors. A capacitive element 208 may have an electrical capacitance in a range from 1 nanofarad to 1000 nanofarads. For example, a capacitive element 208 may have an electrical capacitance of about (e.g., ±1%) 10 nanofarads, about 20 nanofarads, about 50 nanofarads, or the like.

Each row of the array of optical emitters 206 may be connected to (e.g., in a circuit path with) a respective capacitive element 208. For example, a capacitive element 208 B may be connected to Row 1. As shown, for an array that includes multiple rows of optical emitters 206, the driver circuit 200 may include multiple capacitive elements 208, and the multiple capacitive elements 208 may be respectively connected to the multiple rows.

In some implementations, a capacitive element 208 may be directly connected to the optical emitter(s) 206 (e.g., the anodes of the optical emitter(s) 206) of a row of the array of optical emitters 206. That is, the capacitive element 208 may be directly connected to the row. For example, no other circuit components may be in a circuit path between the capacitive element 208 and the optical emitter(s) 206 of the row. Moreover, circuit path inductance can be reduced, thereby reducing optical pulse rise time, by positioning the capacitive element 208 close to the anodes of the optical emitter(s) 206 of the row. For example, a circuit path distance between the capacitive element 208 and the anode of a closest optical emitter 206 of the row may be 5 millimeters (mm) or less, 4 mm or less, 3 mm or less, or 2 mm or less.

The driver circuit 200 may include one or more (e.g., a plurality of) first switches 210 (which may be referred to herein as row switches 210) and/or one or more (e.g., a plurality of) second switches 212 (which may be referred to herein as column switches 212). The row switches 210 may operate in a similar manner as the row switches 108 described above. Each row of the array of optical emitters 206 may be connected to a respective row switch 210. Moreover, each capacitive element 208 may be connected to (e.g., in a circuit path with) a respective row switch 210. For example, a row switch 210 C may be connected to the capacitive element 208 B. A capacitive element 208 may be in a high-side configuration with respect to an associated row switch 210. As described below, a row switch 210 may control charging of a capacitive element 208 that is in the same circuit path as the row switch 210. Thus, in some implementations, the capacitive elements 208 are not directly connected to the source 202. In some implementations, the driver circuit 200 may omit the row switches 210 if the array of optical emitters 206 is a one-dimensional array having a single row.

As shown, charging circuit paths of the driver circuit 200 may include the source 202, a capacitive element 208, and a row switch 210. For example, a first charging circuit path of the driver circuit 200 may include the source 202, a first capacitive element 208, and a first row switch 210; a second charging circuit path of the driver circuit 200 may include the source 202, a second capacitive element 208, and a second row switch 210; and so forth. As shown, for an array that includes multiple rows of optical emitters 206, the driver circuit may include multiple row switches 210 (e.g., respectively connected to the multiple rows) and multiple capacitive elements 208 (e.g., respectively connected to the multiple rows). The multiple row switches 210 may control charging of respective capacitive elements 208 of the multiple capacitive elements 208. In some implementations, a row switch 210 may be connected to additional circuitry that prevents overvoltage supply to the row switch 210.

A row switch 210 may have a closed state (e.g., an on state) where, when the row switch 210 is in the closed state, current may flow through the row switch 210. Additionally, the row switch 210 may have an open state (e.g., an off state), where, when the row switch 210 is in the open state, current may not flow through the row switch 210. In some implementations the driver circuit 200 may include one or more (e.g., a plurality of) third switches 214 (which may be referred to herein as driver switches 214). The driver switches 214 may be configured to drive gates of respective row switches 210. Each row switch 210 may be connected to a respective driver switch 214. For example, a driver switch 214 D may be connected to the row switch 210 C. A driver switch 214 may have a closed state (e.g., an on state) where, when the driver switch 214 is in the closed state, current may flow through the driver switch 214. Additionally, the driver switch 214 may have an open state (e.g., an off state), where, when the driver switch 214 is in the open state, current may not flow through the driver switch 214. Thus, a driver switch 214 in the closed state may drive a gate of a row switch 210.

A row switch 210 may transition to the closed state in response to a "charge" signal, as described above; in the absence of a "charge" signal, the row switch 210 may be in the open state. For example, a driver switch 214 may transition to the closed state in response to the "charge" signal, thereby providing a signal at a gate of the row switch 210 to cause the row switch 210 to transition to the closed state. In some implementations, the driver circuit 200 may include one or more (e.g., a plurality of) additional capacitive elements and/or resistive elements (e.g., resistors) (not shown) that respectively connect the driver switches 214 and the row switches 210. For example, an additional capacitive element and/or resistive element may be between the row switch 210 C and the driver switch 214 D. An additional capacitive element and/or resistive element may enable a driver switch 214, in the closed state, to close a row switch 210 for a short duration (e.g., relative to a duration for which the row switch 210 could be closed if the additional capacitive element and/or resistive element were absent).

In the closed state, a row switch 210 for a particular row may cause current to charge a capacitive element 208 connected to the row (e.g., by completing a circuit path that includes the source 202, the capacitive element 208, and the row switch 210). That is, when the row switch 210 is in the closed state, current may flow through the row switch 210 and charge the capacitive element 208. The driver circuit 200 may be configured to close the row switch 210 for a short duration (e.g., 50 ns or less, 40 ns or less, 30 ns or less, or 20 ns or less), thereby reducing power consumption of the driver circuit 200.

In the open state of a row switch 210 for a particular row, charging of a capacitive element 208 connected to the row is ceased. The row switch 210 may transition from the closed state to the open state when the capacitive element 208 is fully charged or when the capacitive element 208 is partially charged (e.g., charged to a particular level). Opening of the row switch 210 may disconnect the capacitive element 208 from the source 202 (e.g., to enable a discharge mode for the capacitive element 208).

A row switch 210 may be a field effect transistor (FET) (e.g., a p-type FET or an n-type FET). For example, the FET may be a gallium nitride (GaN) FET, a complementary metal-oxide-semiconductor (CMOS) FET, or the like. A driver switch 214 may also be a FET (e.g., an n-type FET), such as a GaN FET, a CMOS FET, or the like.

In some implementations, the circuitry for driving rows of the array of optical emitters 206 (e.g., including the capacitive elements 208, the row switches 210, and/or the driver switches 214) may be included on an integrated circuit.

The column switches 212 may operate in a similar manner as the column switches 110 described above. Each column of the array of optical emitters 206 may be connected to (e.g., in a circuit path with) a respective column switch 212. For example, Column 1 may be connected to a column switch 212 E. As described below, a column switch 212 for a column may control selection of the column (e.g., by completing a cathode path of the column). In some implementations, the driver circuit 200 may omit the column switches 212 if the array of optical emitters 206 is a one-dimensional array having a single column.

As shown, discharging circuit paths of the driver circuit 200 may include a capacitive element 208, an optical emitter 206, and a column switch 212. For example, a first discharging circuit path of the driver circuit 200 may include a first capacitive element 208 of a first row, an optical emitter 206 of the first row and a first column, and a first column switch 212 of the first column; a second discharging circuit path of the driver circuit 200 may include the first capacitive element 208 of the first row, an optical emitter 206 of the first row and a second column, and a second column switch 212 of the second column; and so forth. As shown, for an array that includes multiple columns of optical emitters 206, the driver circuit 200 may include multiple column switches 212 (e.g., respectively connected to the multiple columns) that control selection of respective columns of the multiple columns. In some implementations, a column switch 212 may be connected to additional circuitry to prevent over-voltage spikes to the column switch 212.

A column switch 212 may have a closed state (e.g., an on state) where, when the column switch 212 is in the closed state, current may flow through the column switch 212. Additionally, the column switch 212 may have an open state (e.g., an off state), where, when the column switch 212 is in the open state, current may not flow through the column switch 212. The column switch 212 may transition to the closed state in response to an "on" signal, as described above. The column switch 212 may transition to the open state in response to an "off" signal, as described above. Thus, in the closed state, a column switch 212 for a particular column may select the column. In particular, the column switch 212 in the closed state may cause discharging, of a charged capacitive element 208 of a row, through the row and the column, to provide an electrical pulse to an optical emitter associated with the row and the column. For example, in the closed state, a column switch 212 for a particular column may close (e.g., complete) a cathode path of the column (e.g., current may flow through an optical emitter 206 in a column that has a column switch 212 in the on state in a cathode path of the column). Stated differently, in the closed state, a column switch 212 for a particular column may complete a circuit path that includes the column. In the open state of a column switch 212 for a particular column, the column is no longer selected (e.g., by opening the cathode path of the column).

In some cases, closing of a column switch 212 of a column may not fully discharge a charged capacitive element 208 of a row. For example, a duration for which the column switch 212 is closed may be less than a duration that is needed to fully discharge the capacitive element 208. Here, if a capacitive element 208 of a different row is charged, the closing of the column switch 212 may discharge the capacitive element 208 of the row and the capacitive element 208 of the different row through optical emitters 206 that are in the column. In some implementations, to sequentially pulse optical emitters 206 that are in different rows and in the same column of the array of optical emitters 206, the driver circuit 200 may fully discharge a capacitive element 208 for a first row of the different rows (e.g., by closing the column switch 212 for the column one or more times) before charging a capacitive element 208 for a second row of the different rows.

In some cases, multiple optical emitters 206 in the same row of the array of optical emitters 206 may be pulsed sequentially. Here, a capacitive element 208 for the row may be charged for a duration of the sequential pulsing. That is, the row switch 210 for the row may be held in the closed state for the duration of the sequential pulsing (e.g., the "charge" signal may be applied for the duration of the sequential pulsing). In this way, a constant voltage is maintained on the capacitive element 208 in order to maintain constant pulse amplitudes for the multiple optical emitters 206.

A column switch 212 may be a FET (e.g., an n-type FET). For example, the FET may be a GaN FET, a CMOS FET, or the like. A column switch 212 may be a low side switch. In some implementations, a column switch 212 may be capable of operation in the closed state (e.g., capable of transitioning from the open state to the closed state, and subsequently transitioning from the closed state to the open state) for a time duration in a range from 0.5 ns to 100 ns. In some implementations, a column switch 212 may have a faster switching speed than a row switch 210.

In some implementations, the circuitry for driving columns of the array of optical emitters 206 (e.g., including the column switches 212) may be included on an integrated circuit. That is, the circuitry for driving the columns may be a separate integrated circuit from the integrated circuit for driving the rows.

In an example operation of the driver circuit 200, the driver switch 214 D may transition from the open state to the closed state (e.g., in response to a "charge" signal) to provide a signal to the row switch 210 C to cause the row switch 210 C to transition from the open state to the closed state. The row switch 210 C transitioning from the open state to the closed state may cause current (e.g., from the source 202) to charge the capacitive element 208 B. Upon charging (e.g., fully or partially) of the capacitive element 208 B, the column switch 212 D may transition from the open state to the closed state (e.g., in response to an "on" signal) to cause discharging of the capacitive element 208 B (e.g., a discharge of energy from the capacitive element 208 B) through Row 1 and Column 1 to provide an electrical pulse to the optical emitter 206 A. In response to the electrical pulse, the optical emitter 206 A may emit an optical pulse.

The driver circuit 200 is a high-speed driver circuit capable of generating optical pulses across a range of widths (in a time domain). For example, the driver circuit 200 may generate optical pulses having a width in a range from 0.5 ns to 100 ns. Moreover, the driver circuit 200 may be used to address different optical emitters 206 of the array of optical emitters 206. As described above, locating the capacitive elements 208 close to the anodes of the optical emitters 206 (e.g., in direct connection with the anodes of the optical emitters 206) enables the driver circuit to generate narrow optical pulses with fast rise times.

In some implementations, the driver circuit 200 may generate an optical pulse that is a Gaussian pulse. For example, the driver circuit 200 may be configured to operate in a resonant mode during discharging of a capacitive element 208. Operation in the resonant mode may reduce the rise time of an electrical pulse. Moreover, by operating in the resonant mode, the driver circuit 200 may achieve peak currents for the electrical pulse using capacitive elements 208 that have a relatively small capacitance, thereby facilitating miniaturization of the driver circuit 200. Capacitance values for the capacitive elements 208 may be selected to achieve particular pulse amplitudes and/or pulse shapes. In some implementations, the driver circuit 200 may maintain a constant voltage for a capacitive element 208.

In some implementations, a capacitive element 208 may have a capacitance value that is based on the parameters of the driver circuit 200. For example, a capacitive element 208 may have a capacitance value that minimizes pulse generation at a column switch 212 due to drain-source capacitance during charging of the capacitive element 208. Moreover, a capacitive element 208 may have a capacitance value that is based on a desired width for an electrical pulse (e.g., a pulse width in a range from 0.5 ns to 100 ns), peak current for the electrical pulse (e.g., in a range from 1 Amp to 100 Amps), shape of the electrical pulse (e.g., a rise time and a fall time of the pulse), and/or quantity of cycles (e.g., one or more cycles) for fully discharging the voltage of a capacitive element 208. In some implementations, the capacitive elements 208 for each row of the array of optical emitters 206 may have respective (e.g., different) capacitive values. For example, the capacitive value for a capacitive element 208 of a row may be based on a trace length of the row. In this way, the respective capacitive values for the capacitive elements 208 of each row can be used to tailor pulse shapes for the rows to adjust for respective parasitic inductances of the rows (e.g., due to different trace lengths), thereby equalizing pulse widths for the rows.

As indicated above, FIG. 2 is provided as an example. Other examples may differ from what is described with regard to FIG. 2.

Figure 3:
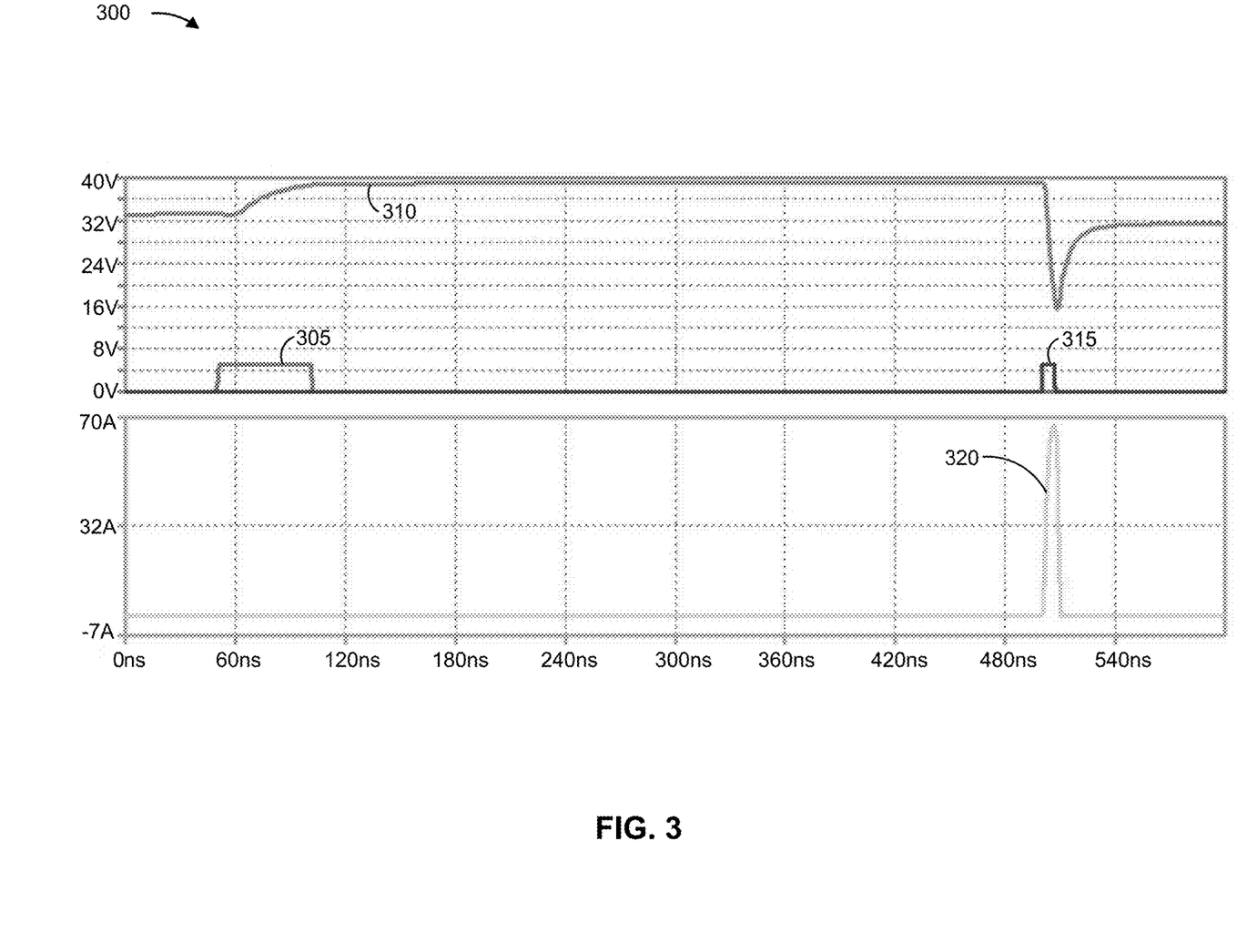
FIG. 3 is a diagram of an example graph plotting electrical signals associated with an example driver circuit described herein.

FIG. 3 is a diagram of an example graph 300 plotting electrical signals associated with an example driver circuit described herein. For example, the electrical signals of the graph 300 may be associated with the driver circuit 200, described above. The graph 300 shows the electrical signals associated with generating an optical pulse at an optical emitter of an array of optical emitters. That is, the optical emitter may be associated with a row and a column of the array of optical emitters.

Line 305 shows a "charge" signal (high voltage). As described above, the "charge" signal causes a row switch (e.g., a row switch 108 or a row switch 210, described above) associated with the row to transition to the closed state. For example, the "charge" signal may cause a driver switch (e.g., a driver switch 214, described above) to transition to the closed state, which in turn may cause the row switch to transition to the closed state. The "charge" signal may have a duration in a range from 10 ns to 60 ns. As shown by the initial portion of line 310, closing of the row switch for the row, in response to the "charge" signal, may cause current to charge a capacitive element (e.g., a capacitive element 106 or a capacitive element 208, described above) connected to the row to a particular voltage.

Line 315 shows an "on" signal (high voltage) followed by an "off" signal (low voltage). As described above, the "on" signal causes a column switch (e.g., a column switch 110 or a column switch 212) associated with the column to transition to the closed state. As shown by the latter portion of line 310, closing of the column switch, in response to the "on" signal, may cause discharging of the capacitive element. For example, a duration for which the column switch is closed (e.g., a duration in a range from 0.5 ns to 100 ns) may correspond to a duration for which the capacitive element discharges. The capacitive element discharges through the row and through the column (e.g., through a circuit path that includes the optical emitter associated with the row and the column) due to the column switch being closed. Discharging of the capacitive element provides an electrical pulse, shown by line 320, at the optical emitter associated with the row and the column. The electrical pulse generates an optical pulse at the optical emitter. A duration of the electrical pulse/optical pulse (e.g., a duration in a range from 0.5 ns to 100 ns) may correspond to a duration for which the column switch is closed.

Accordingly, in some implementations, a method for generating an optical pulse may include causing a row switch, for a row of an array of optical emitters, to transition to a closed state, the row switch in the closed state causing current to charge a capacitive element connected to the row; and/or causing a column switch, for a column of the array of optical emitters, to transition to a closed state, the column switch in the closed state selecting the column and causing the capacitive element to discharge through the row and the column to provide an electrical pulse to an optical emitter associated with the row and the column. In some implementations, a method for generating an optical pulse may include charging a capacitive element, connected to a row of an array of optical emitters, by closing a row switch for the capacitive element; and/or driving an optical emitter associated with the row and a column of the array of optical emitters by closing a column switch for the column to discharge the capacitive element through the row and the column. The aforementioned methods may be performed by one or more processors of a device, one or more controllers of a device, or the like.

As indicated above, FIG. 3 is provided as an example. Other examples may differ from what is described with regard to FIG. 3.

In some implementations, a controller for an array of optical emitters may include the driver circuit architecture 100 or a portion thereof and/or the driver circuit 200 or a portion thereof. For example, the controller may include one or more capacitive elements respectively connected to each row of the array, one or more row switches respectively connected to each capacitive element, and/or one or more column switches respectively connected to each column of the array, in a similar manner as described above. In some implementations, an optical source may include the driver circuit architecture 100 or a portion thereof and/or the driver circuit 200 or a portion thereof. For example, the optical source may include an array of optical emitters, one or more capacitive elements respectively connected to each row of the array, one or more row switches respectively connected to each capacitive element, and/or one or more column switches respectively connected to each column of the array, in a similar manner as described above. In some implementations, an optical system may include the driver circuit architecture 100 or a portion thereof and/or the driver circuit 200 or a portion thereof. For example, the optical system may include an array of optical emitters, one or more capacitive elements respectively connected to each row of the array, one or more row switches respectively connected to each capacitive element, and/or one or more column switches respectively connected to each column of the array, in a similar manner as described above. Moreover, the optical system may include one or more lenses, one or more optical elements (e.g., diffractive optical elements, refractive optical elements, or the like), one or more reflector elements, and/or one or more optical sensors, among other examples. In some implementations the optical system may include the optical source and/or the controller.

In some implementations, the driver circuit architecture 100 or a portion thereof and/or the driver circuit 200 or a portion thereof may be included in a ToF-based (e.g., direct ToF or indirect ToF) measurement system. For example, the ToF-based measurement system may include a LIDAR system. According to some implementations, a method may include generating an optical pulse for ToF-based measurement using the driver circuit architecture 100 or a portion thereof and/or the driver circuit 200 or a portion thereof; and/or detecting an object based on the optical pulse. According to some implementations, a method may include generating (or forming) an array of light spots for three-dimensional sensing using the driver circuit architecture 100 or a portion thereof and/or the driver circuit 200 or a portion thereof. According to some implementations, a method may include generating (or forming) a light pattern for three-dimensional sensing using driver circuit architecture 100 or a portion thereof and/or the driver circuit 200 or a portion thereof.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A driver circuit, comprising:
a source to provide an electrical input;
an array of optical emitters arranged in one or more rows and one or more columns,
wherein the array of optical emitters includes an optical emitter associated with a row of the one or more rows and a column of the one or more columns;
a first switch having an open state and a closed state;
a capacitive element connected to the row,
wherein the first switch in the closed state is to cause charging of the capacitive element; and
a second switch having an open state and a closed state,
wherein the second switch in the closed state is to select the column, and
wherein the second switch in the closed state is to cause discharging of the capacitive element through the row and the column to provide an electrical pulse to the optical emitter associated with the row and the column.

2. The driver circuit of claim 1, wherein the capacitive element is directly connected to the optical emitter.

3. The driver circuit of claim 1, further comprising:
a third switch having an open state and a closed state,
wherein the third switch in the closed state is to drive a gate of the first switch.

4. The driver circuit of claim 3, further comprising:
an additional capacitive element, or a resistive element, between the third switch and the first switch.

5. The driver circuit of claim 1, wherein the array of optical emitters is arranged in multiple rows, and
wherein the first switch is one of multiple first switches respectively connected to the multiple rows, and the capacitive element is one of multiple capacitive elements respectively connected to the multiple rows.

6. The driver circuit of claim 5, wherein the multiple first switches control charging of respective capacitive elements of the multiple capacitive elements.

7. The driver circuit of claim 1, wherein the array of optical emitters is arranged in multiple columns, and
wherein the second switch is one of multiple second switches respectively connected to the multiple columns.

8. The driver circuit of claim 7, wherein the multiple second switches control selection of respective columns of the multiple columns.

9. The driver circuit of claim 1, wherein the first switch in the closed state is to cause charging of the capacitive element through a circuit path that includes the source, the first switch, and the capacitive element.

10. The driver circuit of claim 1, wherein the second switch transitioning from the open state to the closed state is to cause discharging of the capacitive element through a circuit path that includes the capacitive element, the optical emitter, and the second switch.

11. The driver circuit of claim 1, wherein, in response to the electrical pulse, the optical emitter is to emit an optical pulse having a width in a range from 0.5 nanoseconds to 100 nanoseconds.

12. A controller for an array of optical emitters arranged in a plurality of rows and a plurality of columns, comprising:
a plurality of capacitive elements respectively connected to the plurality of rows;
a plurality of first switches respectively connected to the plurality of capacitive elements,
wherein the plurality of first switches have an open state and a closed state, and
wherein a first switch, of the plurality of first switches, in the closed state is to cause current to charge a capacitive element, of the plurality of capacitive elements, for a row of the plurality of rows; and
a plurality of second switches respectively connected to the plurality of columns,
wherein the plurality of second switches have an open state and a closed state, and
wherein a second switch, of the plurality of second switches, connected to a column of the plurality of columns, in the closed state is to cause discharging of the capacitive element through the row and the column.

13. The controller of claim 12, wherein the capacitive element is directly connected to the optical emitter.

14. The controller of claim 12, wherein the plurality of first switches and the plurality of second switches are field effect transistors.

15. The controller of claim 12, wherein the plurality of first switches are high side switches, and the plurality of second switches are low side switches.

16. The controller of claim 12, wherein the plurality of capacitive elements are directly connected to the plurality of rows.

17. An optical source, comprising:
an array of optical emitters arranged in one or more rows and one or more columns; and
a driver circuit, comprising:
one or more capacitive elements respectively connected to the one or more rows,
wherein the one or more capacitive elements are configured to discharge through respective rows of the one or more rows;
one or more first switches having an open state and a closed state,
wherein a first switch, of the one or more first switches, in the closed state is to cause current to charge a capacitive element, of the one or more capacitive elements, for a row of the one or more rows; and
one or more second switches respectively connected to the one or more columns,
wherein the one or more second switches have an open state and a closed state, and
wherein a second switch, of the one or more second switches, in the closed state is to select a column of the one or more columns.

18. The optical source of claim 17, wherein the second switch in the closed state is to cause a capacitive element, of the one or more capacitive elements, for a row, of the one or more rows, to discharge energy through an optical emitter, of the array of optical emitters, associated with the row and the column.

19. The optical source of claim 17, wherein the driver circuit is configured to operate in a resonant mode during discharging of the one or more capacitive elements.

20. The optical source of claim 17, wherein the one or more capacitive elements are directly connected to the one or more rows.

* * * * *